US012804289B2

(12) United States Patent
Fadida

(10) Patent No.: US 12,804,289 B2
(45) Date of Patent: Nov. 17, 2026

(54) IMAGE SENSOR WITH IN-PIXEL HISTOGRAMMING

(71) Applicant: SEMICONDUCTOR COMPONENTS INDUSTRIES, LLC, Scottsdale, AZ (US)

(72) Inventor: Gal Fadida, Odem (IL)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 115 days.

(21) Appl. No.: 18/989,932

(22) Filed: Dec. 20, 2024

(65) Prior Publication Data

US 2026/0181285 A1 Jun. 25, 2026

(51) Int. Cl.

| | |
|---|---|
| ***H04N 25/773*** | (2023.01) |
| ***H04N 25/46*** | (2023.01) |
| ***H04N 25/76*** | (2023.01) |
| *H10F 39/00* | (2025.01) |

(52) U.S. Cl.

CPC .......... *H04N 25/773* (2023.01); *H04N 25/46* (2023.01); *H04N 25/7795* (2023.01); *H10F 39/8037* (2025.01)

(58) Field of Classification Search

CPC .. H04N 25/773; H04N 25/46; H04N 25/7795; H10F 39/8037

See application file for complete search history.

(56) References Cited

U.S. PATENT DOCUMENTS

| | | | | |
|---|---|---|---|---|
| 2013/0077082 A1* | 3/2013 | Mellot | G01S 17/36 315/246 |
| 2020/0284883 A1* | 9/2020 | Ferreira | G01S 7/497 |
| 2021/0080576 A1* | 3/2021 | Moore | G01S 17/36 |
| 2021/0141069 A1* | 5/2021 | Shimizu | G01S 7/497 |
| 2021/0247502 A1* | 8/2021 | Kim | G01S 17/10 |
| 2022/0308189 A1* | 9/2022 | Wang | G01S 7/4863 |
| 2023/0013026 A1* | 1/2023 | Tsai | G01T 1/247 |

(Continued)

OTHER PUBLICATIONS

Su-Hyun Han et al., A 100×80 CMOS Flash LiDAR Sensor with 0.0011mm2 In-Pixel Histogramming TDC Based on Analog Counter and Self-Calibrated Single-Slope ADC, 2022 IEEE Symposium on VLSI Technology and Circuits (VLSI Technology and Circuits), Jun. 12-17, 2022, pp. 82-83, IEEE.

(Continued)

*Primary Examiner* — Nhan T Tran

(74) *Attorney, Agent, or Firm* — Slayden Grubert Beard PLLC

(57) ABSTRACT

Imaging circuitry is provided that includes an array of image pixels, where each image pixel in the array includes a single-photon avalanche diode (SPAD) coupled to a plurality of counters configured to obtain an in-pixel histogram and time gate driver circuitry configured to output a plurality of non-overlapping time gate pulses to the plurality of counters. Each image pixel can further include a pulse generator having an input coupled to the SPAD. Each of the counters can have a first input coupled to an output of the pulse generator and a second input configured to receive a respective one of a plurality of time gate signals. Each of the counters can further include an analog memory circuit having one or more capacitors.

18 Claims, 9 Drawing Sheets

(56) References Cited

U.S. PATENT DOCUMENTS

| | | | | |
|---|---|---|---|---|
| 2023/0324853 | A1* | 10/2023 | Kappel | G01S 7/4863 341/111 |
| 2023/0333217 | A1* | 10/2023 | Fine | G01S 17/18 |
| 2025/0039582 | A1* | 1/2025 | Ding | G01S 17/18 |
| 2025/0373959 | A1* | 12/2025 | Otaka | H04N 25/773 |
| 2026/0003043 | A1* | 1/2026 | Perruchoud | G01S 7/4863 |
| 2026/0046534 | A1* | 2/2026 | Liu | G01S 7/4865 |

OTHER PUBLICATIONS

Bumjun Kim et al., A 48×40 13.5mm Depth Resolution Flash LiDAR Sensor with In-Pixel Zoom Histogramming Time-to-Digital Converter, 2021 IEEE International Solid-State Circuits Conference (ISSCC), Feb. 13-22, 2021, pp. 108-110, IEEE.
Hyeongseok Seo et al., Direct TOF Scanning LiDAR Sensor With Two-Step Multievent Histogramming TDC and Embedded Interference Filter, IEEE Journal of Solid-State Circuits, Apr. 2021, pp. 1022-1035, vol. 56, No. 4, IEEE.
F. Villa et al., SPAD Smart Pixel for Time-of-Flight and Time-Correlated Single-Photon Counting Measurements, IEEE Photonics Journal, Jun. 2012, pp. 795-804, vol. 4, No. 3, IEEE.
Chao Zhang et al., A 30-frames/s, 252×144 SPAD Flash LiDAR With 1728 Dual-Clock 48.8-ps TDCs, and Pixel-Wise Integrated Histogramming, IEEE Journal of Solid-State Circuits, Apr. 2019, pp. 1137-1151, vol. 54, No. 4, IEEE.

* cited by examiner

IMAGE SENSOR WITH IN-PIXEL HISTOGRAMMING

BACKGROUND

Image sensors are commonly used in electronic devices such as cellular telephones, cameras, computers, automobiles, and other systems to capture images. In a typical arrangement, an image sensor includes an array of image pixels arranged in pixel rows and pixel columns. Each image pixel can include a photosensitive element coupled to associated transistors.

It is within this context that the embodiments described herein arise.

DETAILED DESCRIPTION

Embodiments of the present technology relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as single-photon avalanche diodes (SPADs) that convert impinging photons into electrons or holes.

Image sensor pixels that include SPADs may be referred to herein as SPAD based imaging pixels. Image sensors that include SPAD based imaging pixels may be referred to as SPAD based image sensors. SPAD based image sensors may have any number of pixels (e.g., hundreds, thousands, or millions of pixels. Image sensors may include control circuitry such as circuitry for operating the pixels and readout circuitry for reading out image signals corresponding to the electric charge generated by the photosensitive elements.

Figure 1:
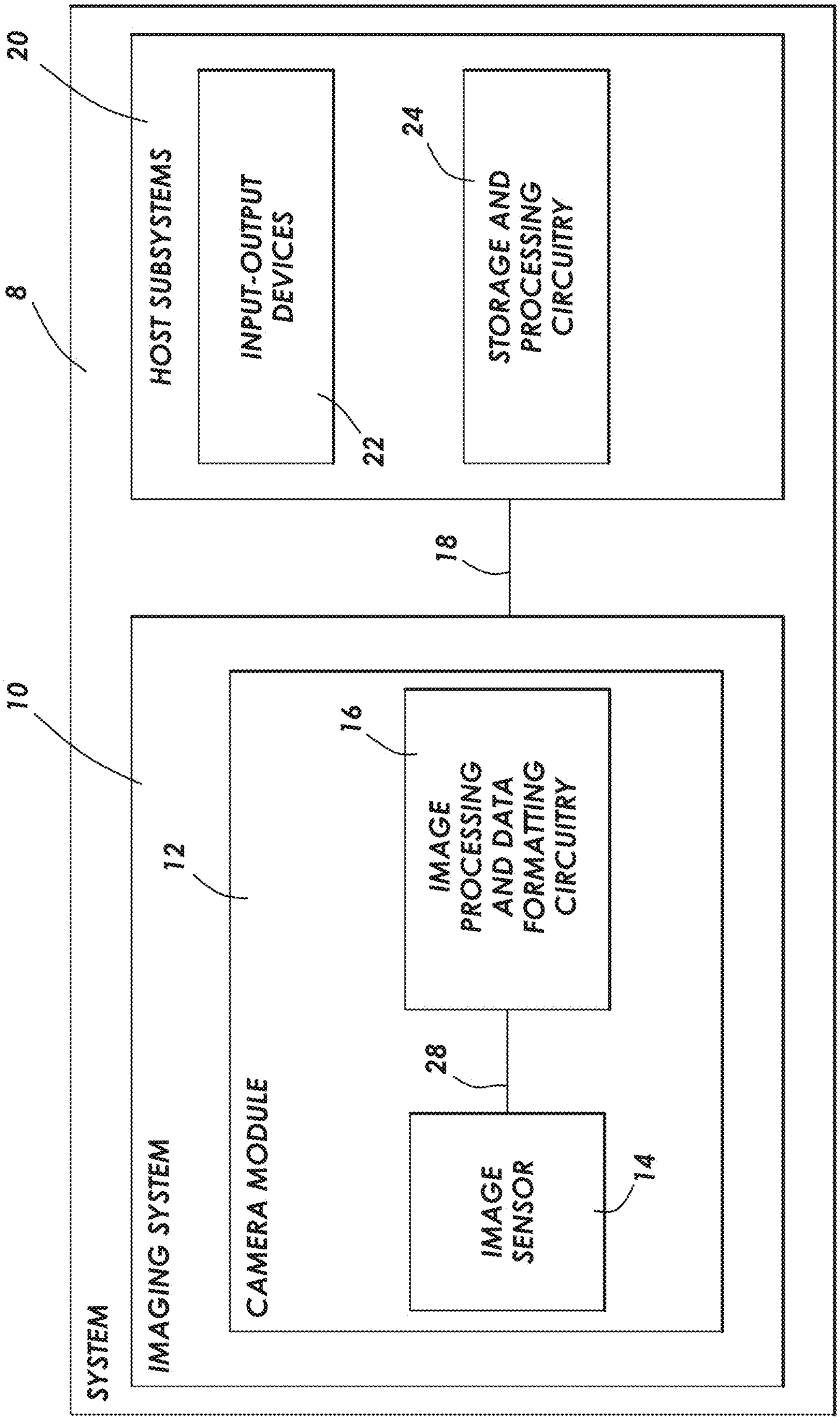
FIG. 1 is a diagram of an illustrative electronic device having an image sensor in accordance with some embodiments.

FIG. 1 is a diagram of an illustrative imaging and response system including an imaging system that uses an image sensor to capture images. System 8 of FIG. 1 may be an electronic device such as a camera, a cellular telephone, a video camera, or other electronic device that captures digital image data, may be a vehicle safety system (e.g., an active braking system or other vehicle safety system), or may be a surveillance system. As shown in FIG. 1, system 8 may include an imaging system such as imaging system 10 and host subsystems such as host subsystem 20. Imaging system 10 may include camera module 12. Camera module 12 may include one or more image sensors 14, such as in an image sensor array integrated circuit, and one or more lenses. Image sensor 14 may be a SPAD based image sensor. During image capture operations, each lens may focus light onto an associated SPAD based image sensor 14. Image sensor 14 may include photosensitive elements (i.e., SPAD based image sensor pixels) that convert the light into corresponding data. Image sensors may have any number of pixels (e.g., hundreds, thousands, millions, or more). A typical image sensor may, for example, have millions of pixels (e.g., megapixels).

Each image sensor in camera module 12 may be identical or there may be different types of image sensors in a given image sensor array integrated circuit. In some examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), and/or address circuitry.

Still and video image data from image sensor 14 may be provided to image processing and data formatting circuitry 16 via path 28. Image processing and data formatting circuitry 16 may be used to perform image processing functions such as data formatting, adjusting white balance and exposure, implementing video image stabilization, or face detection. Image processing and data formatting circuitry 16 may additionally or alternatively be used to compress raw camera image files if desired (e.g., to Joint Photographic Experts Group or JPEG format).

In one example arrangement, such as a system on chip (SoC) arrangement, sensor 14 and image processing and data formatting circuitry 16 are implemented on a common semiconductor substrate (e.g., a common silicon image sensor integrated circuit die). If desired, sensor 14 and image processing circuitry 16 may be formed on separate semiconductor substrates. For example, sensor 14 and image processing circuitry 16 may be formed on separate substrates that have been stacked.

Imaging system 10 may convey acquired image data to host subsystem 20 over path 18. Host subsystem 20 may include input-output devices 22 and storage processing circuitry 24. Host subsystem 20 may include processing software for detecting objects in images, detecting motion of objects between image frames, determining distances to objects in images, or filtering or otherwise processing images provided by imaging system 10. For example, image processing and data formatting circuitry 16 of the imaging system 10 may communicate the acquired image data to storage and processing circuitry 24 of the host subsystems 20.

If desired, system 8 may provide a user with numerous high-level functions. In a computer or cellular telephone, for example, a user may be provided with the ability to run user applications. For these functions, input-output devices 22 of host subsystem 20 may include keypads, input-output ports, buttons, and displays and storage and processing circuitry 24. Storage and processing circuitry 24 of host subsystem 20 may include volatile and/or nonvolatile memory (e.g., random-access memory, flash memory, hard drives, solid-state drives, etc.). Storage and processing circuitry 24 may additionally or alternatively include microprocessors, microcontrollers, digital signal processors, and/or application specific integrated circuits.

Figure 2:
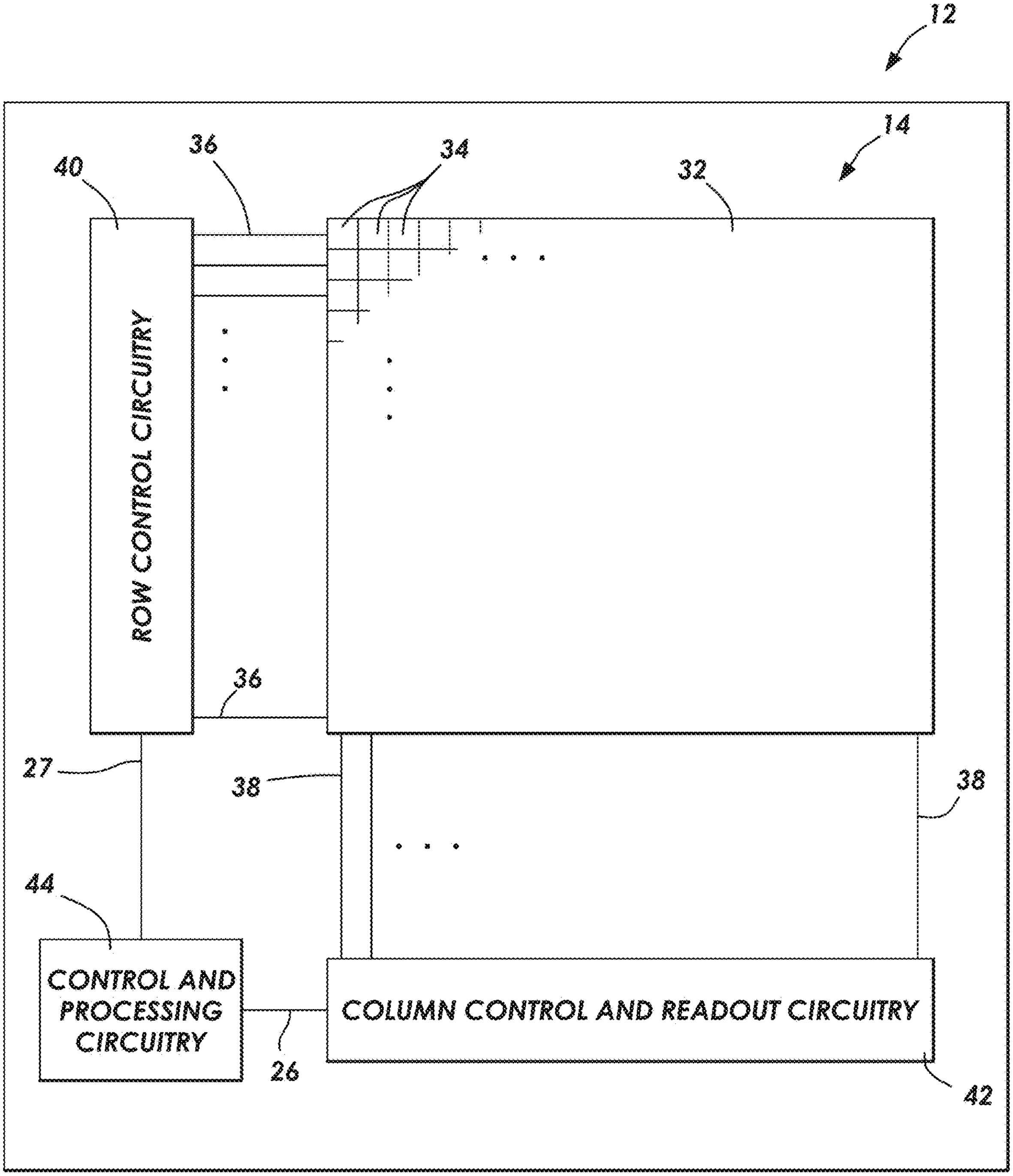
FIG. 2 is a diagram of an illustrative pixel array and associated row and column control circuitry for reading out signals from an image sensor in accordance with some embodiments.

An example of an arrangement of SPAD based image sensor 14 of FIG. 1 is shown in FIG. 2. As shown in FIG. 2, image sensor 14 may include control and processing circuitry 44. Control and processing circuitry 44 (sometimes referred to as control and processing logic) may be part of image processing and data formatting circuitry 16 in FIG. 1 or may be separate from circuitry 16. Image sensor 14 may include a pixel array such as array 32 of SPAD based pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over one or more control paths 36. The row control signals may include pixel reset control signals, charge transfer control signals, blooming control signals, row select control signals, dual conversion gain control signals, or any other desired pixel control signals.

Column control and readout circuitry 42 may be coupled to one or more of the columns of pixel array 32 via one or more conductive lines such as column lines 38. A given column line 38 may be coupled to a column of image pixels 34 in image pixel array 32 and may be used for reading out image signals from image pixels 34 and for supplying bias signals (e.g., bias currents or bias voltages) to image pixels 34. In some examples, each column of pixels may be coupled to a corresponding column line 38. For image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, or column memory for storing the readout signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure. Features described herein as rows may be arranged vertically and features described herein as columns may be arranged horizontally.

Pixel array 32 may optionally be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels. The red, green, and blue image sensor pixels may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another example, broadband image pixels having broadband color filter elements (e.g., clear color filter elements) may be used instead of green pixels in a Bayer pattern. These examples are merely illustrative and, in general, color filter elements of any desired color (e.g., cyan, yellow, red, green, blue, etc.) and in any desired pattern may be formed over any desired number of image pixels 34.

Figure 3:
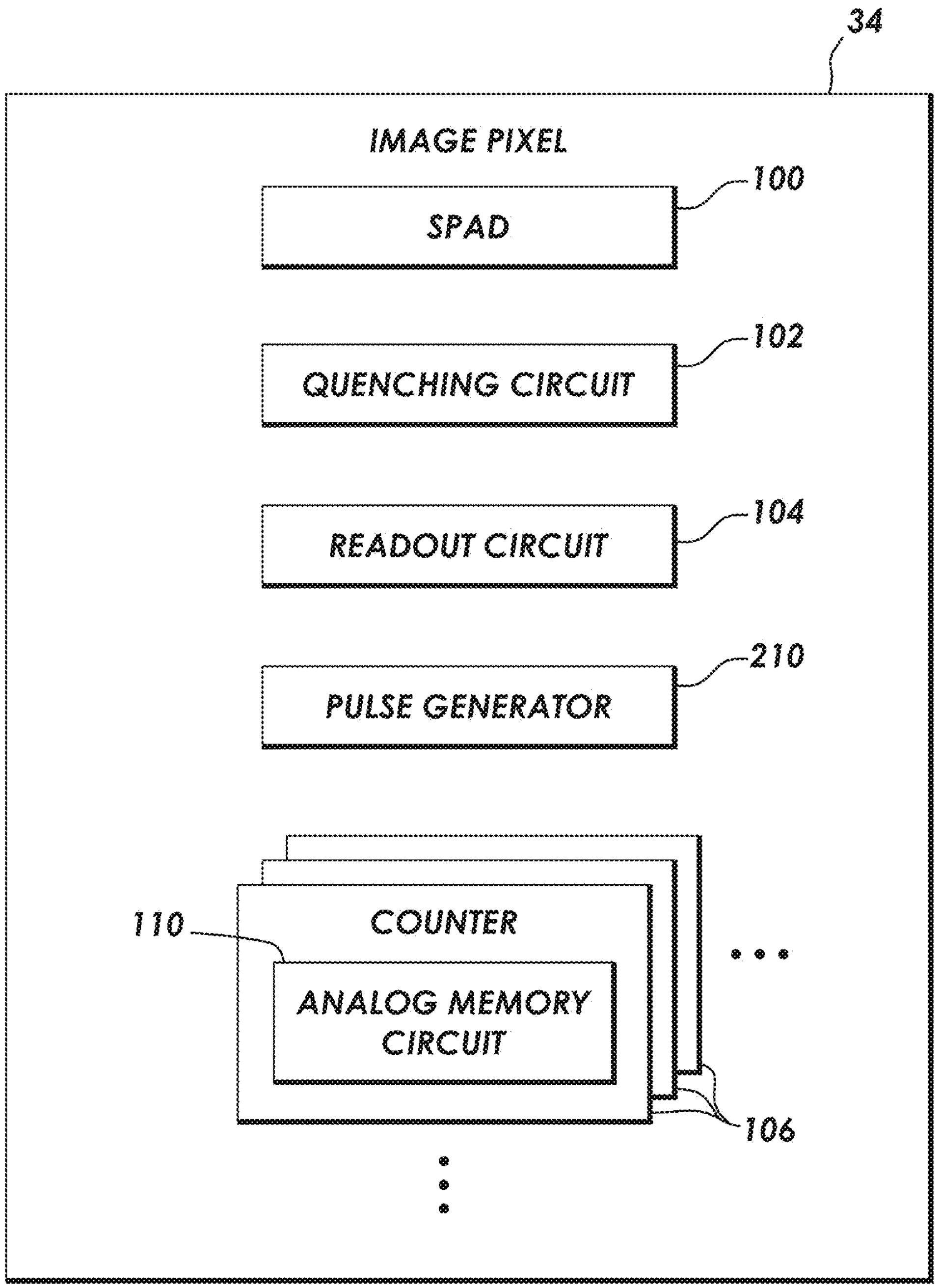
FIG. 3 is a diagram of an illustrative single-photon avalanche diode (SPAD) based image pixel in accordance with some embodiments.

FIG. 3 is a block diagram of an illustrative SPAD based image pixel such as image pixel 34. SPAD based image sensors can be configured to count the number of impinging photons. Such type of photon-counting image sensor can provide improved low light signal-to-noise ratio (SNR) while maintaining high dynamic range. In accordance with an embodiment, an image sensor is provided that includes an array of SPAD based image pixels having a design that is technically advantageous due to its minimal area overhead and reduced power consumption compared to other state-of-the-art SPAD based image sensors. As shown in FIG. 3, image pixel 34 can include a single-photon avalanche diode such as SPAD 100, an associated quenching circuit such as quenching circuit 102, readout circuitry such as readout circuitry 104, a pulse generating circuit such as pulse generator 210, one or more counters such as counters 106, and optionally other circuit components. Each counter 106 can include a storage circuit such as analog memory circuit 110. Analog memory circuit 110 can be configured to store charge in the analog domain.

SPAD 100, sometimes referred to as a light-sensing diode, may be biased above its breakdown point and when an incident photon from a light source generates an electron or hole, this carrier initiates an avalanche breakdown with additional carriers being generated. The avalanche multiplication may produce a current signal that can be easily detected by readout circuitry 104 associated with the SPAD 100. The avalanche process needs to be stopped (quenched) by lowering the diode bias below its breakdown point. For example, the control circuitry such as circuitry 40 and/or 44 in FIG. 2 may operate quenching circuit 102 or other adjustable (transistor) circuitry within each SPAD pixel to control one or more bias voltages provided to each SPAD pixel.

Figure 4:
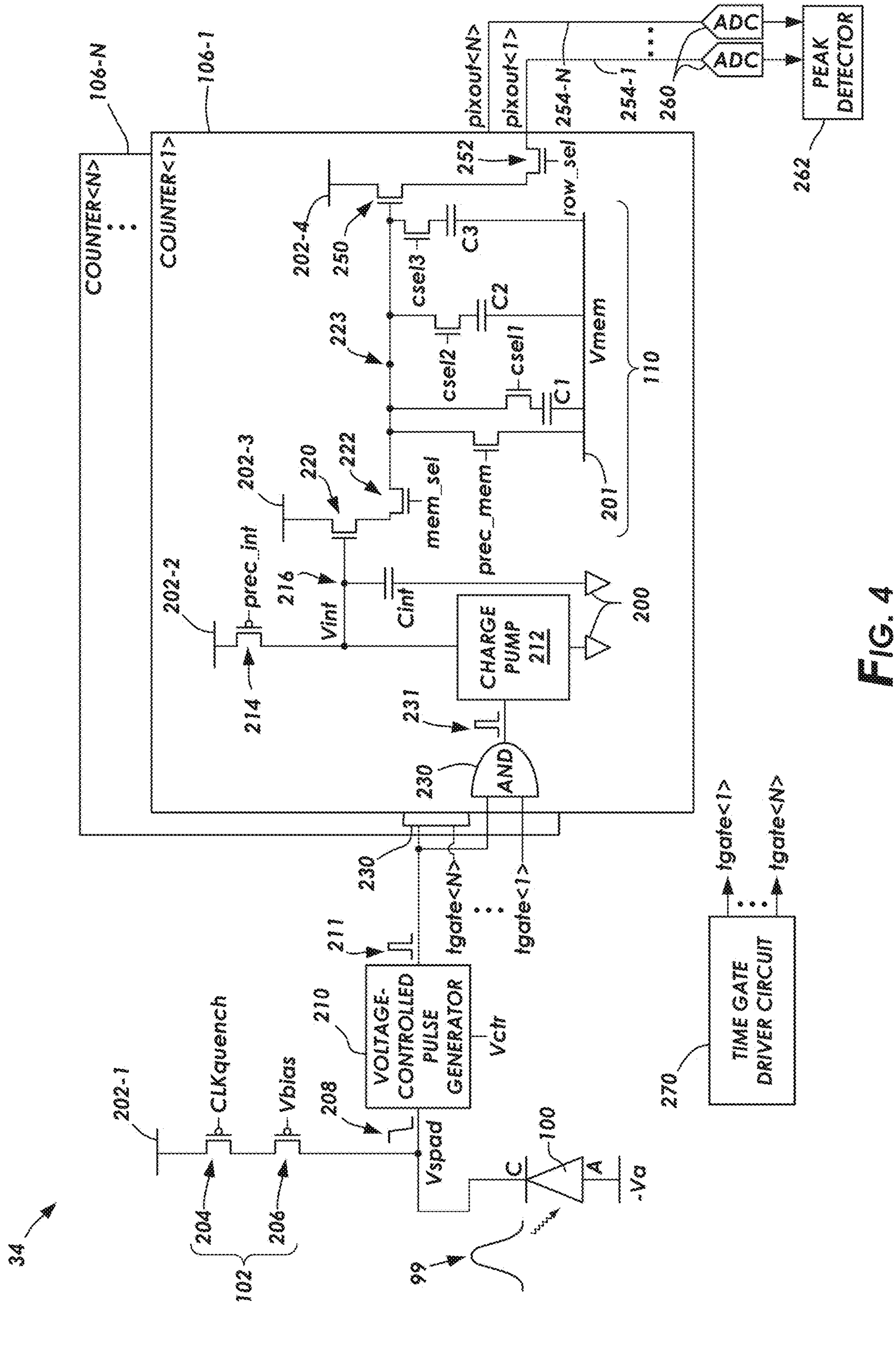
FIG. 4 is a circuit diagram showing an illustrative implementation of an image pixel of the type shown in FIG. 3 in accordance with some embodiments.

FIG. 4 is a circuit diagram showing one illustrative implementation of the SPAD based image pixel 34 of the type shown in FIG. 3. As shown in FIG. 4, image pixel 34 may include a lighting-sensing diode or SPAD 100 having an anode (A) terminal coupled to a voltage line (e.g., a voltage line on which a negative anode bias voltage −Va can be provided), quenching circuit 102 coupled to a cathode (C) terminal of SPAD 100, a voltage-controlled pulse generator 210 having an input coupled to the cathode terminal of SPAD 100, and multiple counters 106 coupled to an output of the voltage-controlled pulse generator 210. This example in which the anode bias voltage −Va is a negative voltage is illustrative. If desired, the anode terminal of SPAD 100 can alternatively be biased to 0 V, a ground voltage, or a positive voltage. In response to receiving a single photon 99 (e.g., a laser pulse), SPAD 100 can produce a carrier that results in a detectable change in voltage Vspad at the cathode terminal. Voltage Vspad is sometimes referred to herein as the cathode terminal voltage. In general, an impinging photon or laser pulse may result in a corresponding detectable falling edge (see, e.g., falling edge 208) or rising edge in the cathode voltage Vspad.

The quenching circuit 102 can include a quenching transistor 204 and a cascode transistor 206. Quenching transistor 204 may be a p-type transistor such as a p-channel metal-oxide-semiconductor (PMOS) transistor having a source terminal coupled to a first positive power supply line 202-1, a gate terminal configured to receive a quench clock signal CLKquench, and a source terminal coupled to cascode transistor 206. A positive power supply voltage can be provided on power supply line 202-1. The terms "source" and "drain" are sometimes used interchangeably when referring to current-conducting terminals of a metal-oxide-semiconductor transistor. The source and drain terminals are therefore sometimes referred to as "source-drain" terminals. For instance, transistor 204 has at least a first source-drain terminal and a second source-drain terminal.

The term "activate" with respect to a switch (or transistor) may refer to or be defined herein as an action that places the switch in an "on" or low-impedance state such that the two terminals of the switch are electrically connected to conduct current. Activating a switch can sometimes be referred to as turning on or closing a switch. The term "deactivate" with respect to a switch (or transistor) may refer to or be defined herein as an action that places the switch in an "off" or high-impedance state such that the two terminals of the switch/transistor are electrically disconnected with minimal leakage current. Deactivating a switch can sometimes be referred to as turning off or opening a switch.

Cascode transistor 206 may be a p-type (PMOS) transistor having a source terminal coupled to quench transistor 204, a drain terminal coupled to the cathode terminal of SPAD 100, and a gate terminal configured to receive a cascode bias voltage Vbias. Bias voltage Vbias can be generated by an associated bias voltage generation circuit. Cascode transistor 206 is optional and can be omitted from pixel 34. If cascode transistor 206 were to be omitted from pixel 34, the drain terminal of quench transistor 204 would be directly coupled to the cathode terminal of SPAD 100. Signal CLKquench can be generated by associated quench control logic, which can be included as part of row control circuitry 40 or control and processing circuitry 44 in FIG. 2.

Voltage-controlled pulse generator 210 can be configured to receive voltage Vspad from the cathode terminal of SPAD 100 and a control voltage Vctr. Configured in this way, voltage-controlled pulse generator (VCPG) 210 can be configured to detect a falling edge 208 in the cathode voltage Vspad and to generate a corresponding pulse signal 211 in response to the detected falling edge.

Figure 5:
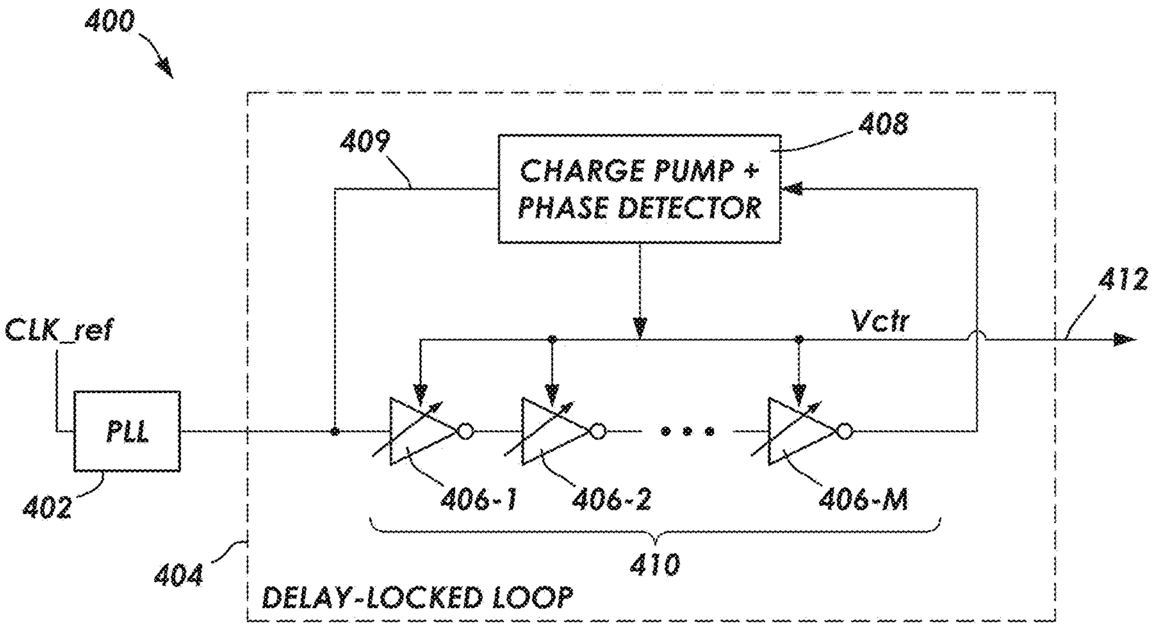
FIG. 5 is a circuit diagram of an illustrative delay-locked loop (DLL) circuit configured to generate a control voltage signal in accordance with some embodiments.

The control voltage Vctr for tuning or adjusting voltage-controlled pulse generator 210 may be produced by a control voltage generator such as control voltage generator 400 shown in FIG. 5. As shown in FIG. 5, control voltage generator 400 can include a phase-locked loop (PLL) 402 coupled to a delay-locked loop (DLL) 404. The PLL 402 can have an input configured to receive a reference clock signal CLK_ref and an output coupled to DLL 404. Delay-locked loop 404 may include a series of M inverting circuits such as inverters 406-1, 406-2, . . . , and 406-M, sometimes referred to as a chain of inverters. In general, M can represent an integer that is greater than five, greater than ten, 10-20, 20-50, 50-100, or more than 100.

The output of the last inverter 406-M may be coupled to an input of charge pump and phase detector circuit 408. The charge pump and phase detector circuit 408 can have another input that is coupled to an input of the first inverter 406-1 via path 409. Charge pump and phase detector 408 can output control voltage Vctr for tuning the delay of the M series-connected inverters. The M series-connected inverters configured in this way is sometimes referred to as a voltage-controlled delay line 410. Each inverter 406 having a drive strength that is modulated by Vctr is sometimes referred to as a "current-starved" inverter. Control voltage generator 400 can be disposed along a peripheral edge of the image pixel array, where control voltage Vctr is conveyed to each SPAD based pixel 34 via control line 412.

Figure 6:
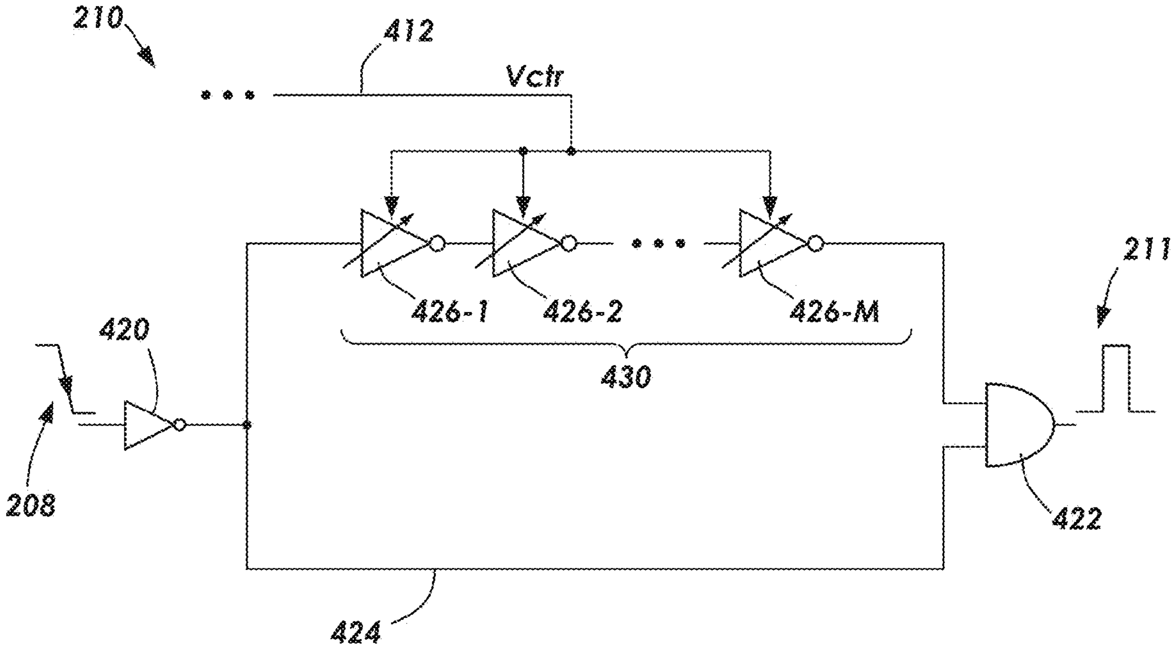
FIG. 6 is a circuit diagram of an illustrative voltage-controlled pulse generator that can be controlled by the control voltage signal generated by the DLL circuit of FIG. 8 in accordance with some embodiments.

FIG. 6 is a circuit diagram of an illustrative voltage-controlled pulse generator 210 disposed within each SPAD based image pixel 34. As shown in FIG. 6, voltage-controlled pulse generator 210 may include an input inverter 420 and a series of M inverting circuits such as inverters 426-1, 426-2, . . . , and 426-M, sometimes referred to as a chain of starved inverters. Inverter 420 has an input configured to receive a falling edge 208 of voltage Vspad and has an output that is coupled to an input of the first inverter 426-1. Although the number of inverters 426 in voltage-controlled pulse generator 210 is shown as being equal to the number of inverters 406 in the voltage-controlled delay line 410 of control voltage generator 400, the number of inverters 426 in voltage-controlled pulse generator 210 can be less than or greater than the number of inverters 406 in the voltage-controlled delay line 410 of control voltage generator 400. The M series-connected inverters 426 configured in this way is sometimes also referred to as a voltage-controlled delay line 430.

Each inverter 426 in delay line 430 may be a copy or replica of the inverters 406 in delay line 410. In other words, inverters 406 and 426 can exhibit the same drive strength and transistor sizing. If desired, delay line 410 and/or delay line 430 can optionally include always-active logic AND gates coupled in series with the inverters for improved matching. Each inverter 426 can have a drive strength that is modulated by Vctr provided over signal line 412. Voltage-controlled pulse generator 210 may further include a logic gate such as logic AND gate 422 having a first input coupled to an output of the last inverter 426-M, a second input coupled to an input of the first inverter 426-1 in delay line 430 via connection 424, and an output on which pulse signal 211 can be generated (see also FIG. 4). Configured in this way, pulse signal 211 can exhibit a pulse width that is locked with minimal sensitivity to process, voltage, and temperature (PVT) variations.

Referring back to FIG. 4, the output of voltage-controlled pulse generator 210 can be coupled to multiple counters 106. In the example of FIG. 4, the output of pulse generator 210 is coupled to N counters including a first counter 106-1, a second counter 106-2, . . . , and an $N^{th}$ counter 106-N. In general, N can represent an integer that is greater than five, greater than ten, 10-20, 20-50, 50-100, or more than 100. Each counter 106 can include a logic gate such as logic AND gate 230, a charge pumping circuit such as charge pump 212, a capacitor such as integration capacitor Cint, and a precharge switch such as precharge transistor 214, a first source follower transistor such as a n-type metal-oxide-semiconductor (NMOS) source follower (SF) transistor 220, a storage circuit such as analog memory circuit 110, a second source follower transistor such as NMOS source follower (SF) transistor 250, and a row selection switch such as row select transistor 252. The second source follower transistor 250 and row select transistor 252 may be considered part of readout circuitry 104 in FIG. 3.

The logic AND gate 230 of each counter 106 can have a first input configured to receive a pulse signal 211 from the output of voltage-controlled pulse generator 210, a second input configured to receive a time gate signal tgate<i> from a time gate driver circuit 270, and an output coupled to a corresponding charge pump 212 in that counter. Time gate driver circuit 270 may be configured to produce N different time gate signals tgate<1>, tgate<2>, . . . , and tgate<N>. For instance, logic AND gate 230 of counter 106-1 may have a second input configured to receive time gate signal tgate<1>; logic AND gate 230 of counter 106-2 may have a second input configured to receive time gate signal tgate<2>; . . . ; and logic AND gate 230 of counter 106-N may have a second input configured to receive time gate signal tgate<N>.

Figure 7:
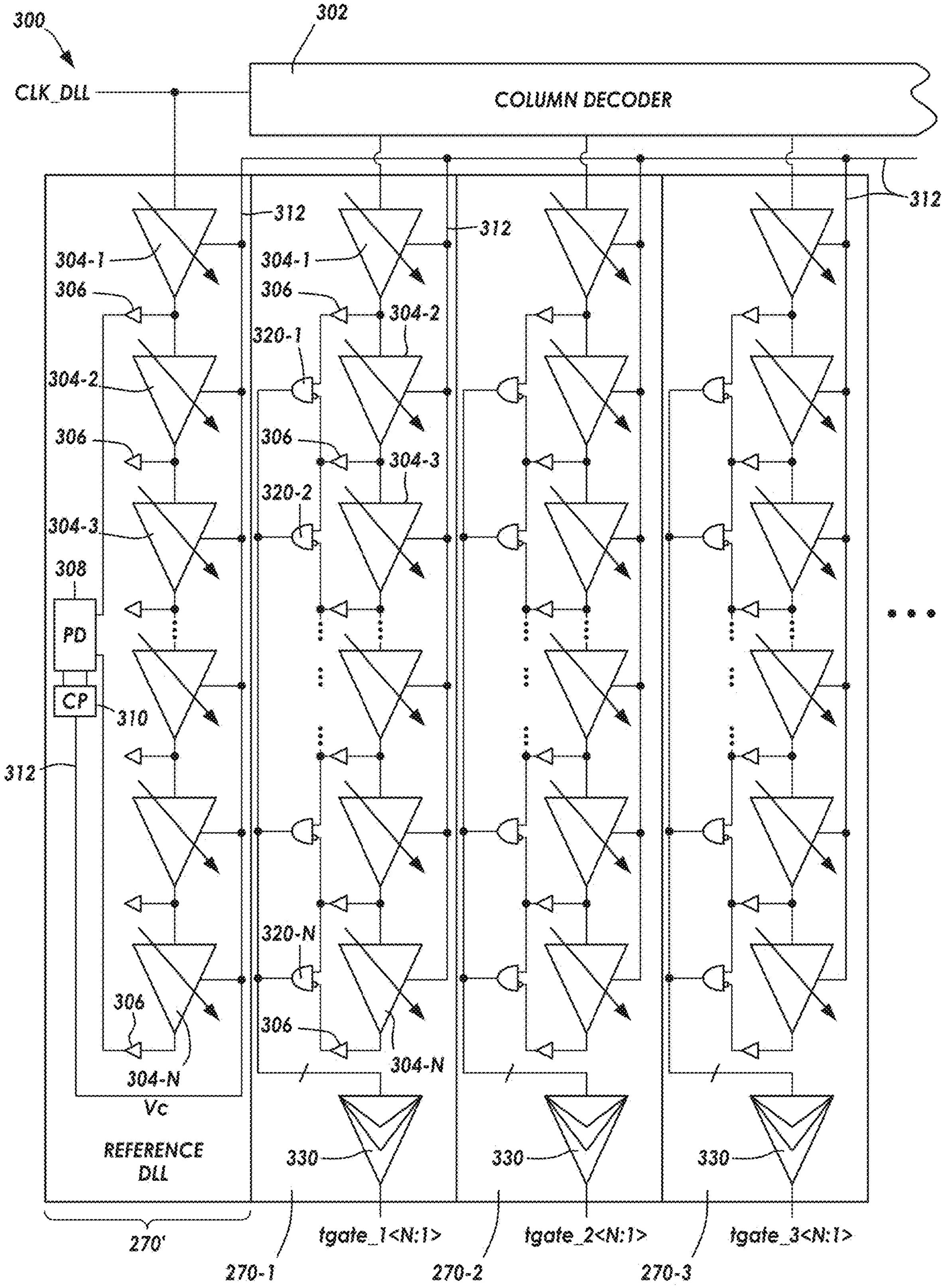
FIG. 7 is a circuit diagram of illustrative time gate driver circuits in accordance with some embodiments.

FIG. 7 is a circuit diagram of illustrative time gate driver circuitry 300 in accordance with some embodiments. As shown in FIG. 7, time gate driver circuitry 300 can include a column decoding circuit such as column decoder 302, a reference delay locked loop (DLL) 270', one or more associated time gate driver circuits 270 such as a first time gate driver circuit 270-1, a second time gate driver circuit 270-2, a third time gate driver circuit 270-3, and so on. A clock signal such as a DLL clock signal CLK_DLL can be conveyed to an input of reference DLL 270' and to an input of column decoder 302. Reference DLL 270' can include a chain of N inverters 304 such as inverters 304-1, 304-2, 304-3, . . . , and 304-N. A buffer circuit such as buffer 306 can be coupled at the output of each inverter 304 in the chain. The reference DLL 270's can further include a phase detector (PD) 308 and a charge pump (CP) 310. Phase detector 308 may have a first input coupled to buffer 306 connected at the output of the first inverter 304-1, a second input coupled to buffer 306 connected at the output of the $N^{th}$ inverter 304-N, and an output coupled to charge pump 310. Based on signals output from phase detector 308, charge pump 310 may produce a corresponding control voltage Vc on control line 312 that is fed to the control terminal of each inverter 304 within the reference DLL 270'. Each inverter 304 having a drive strength that is modulated by voltage Vc is sometimes referred to as a "current-starved" inverter.

Each time gate driver 270 can similarly include a chain of N inverters 304 such as inverters 304-1, 304-2, 304-3, . . . , and 304-N coupled together in series. The N inverters 304 of each time gate driver 270 can exhibit a drive strength that is modulated by control voltage Vc received from reference DLL 270'. A buffer circuit such as buffer 306 can be coupled at the output of each inverter 304 in the chain. In other words, buffers 306 are tapping different nodes along the delay line. Time gate driver 270 can further include logic gates such as N logic AND gates 320. For example, the first logic AND gate 320 can include a first (non-inverting) input coupled to buffer 306 connected at the output of the first inverter 304-1, a second (inverting) input coupled to buffer 306 connected at the output of the second inverter 304-2, and an output on which time gate signal tgate<1> is generated. The second logic AND gate 320 can include a first (non-inverting) input coupled to buffer 306 connected at the output of the second inverter 304-2, a second (inverting) input coupled to buffer 306 connected at the output of the third inverter 304-3, and an output on which time gate signal tgate<2> is generated. The $N^{th}$ logic AND gate 320 can include a first (non-inverting) input coupled to buffer 306 connected at the output of the penultimate inverter 304, a second (inverting) input coupled to buffer 306 connected at the output of the last inverter 304-N, and an output on which time gate signal tgate<N> is generated. These time gate signals tgate<1>, tgate<2>, . . . , tgate<N−1>, and tgate<N> can be conveyed to output buffer/drivers 330 to produce signals tgate<N:1> which are then fed to the N different counters 106 in a given image pixel 34.

Having multiple time gate drivers 270 as shown in the example of FIG. 5 is optional but can be technically advantageous and beneficial so that each time gate driver 270 can be used to drive a separate group of image pixels 34. For example, time gate driver 270-1 can be configured to output time gate signals tgate_1<N:1> for driving a first group of pixel columns; time gate driver 270-2 can be configured to output time gate signals tgate_2<N:1> for driving a second group of pixel columns different than the first group of pixel columns; and time gate driver 270-3 can be configured to output time gate signals tgate_3<N:1> for driving a third group of pixel columns different than the first and second groups of pixel columns. Column decoder 302 can be operated to scan or illuminate only portions of the image pixel array at any point in time, thus providing greater flexibility in operating modes while saving power. The example of FIG. 5 in which time gate driver circuitry 300 includes one reference DLL 270' and three associated time gate driver circuits 270 is merely illustrative. In general, time gate driver circuitry 300 may include one or more time gate driver circuits 270, two or more time gate driver circuits 270, three or more time gate driver circuits 270, three to ten time gate driver circuits 270, or more than ten time gate driver circuits 270.

Figure 8:
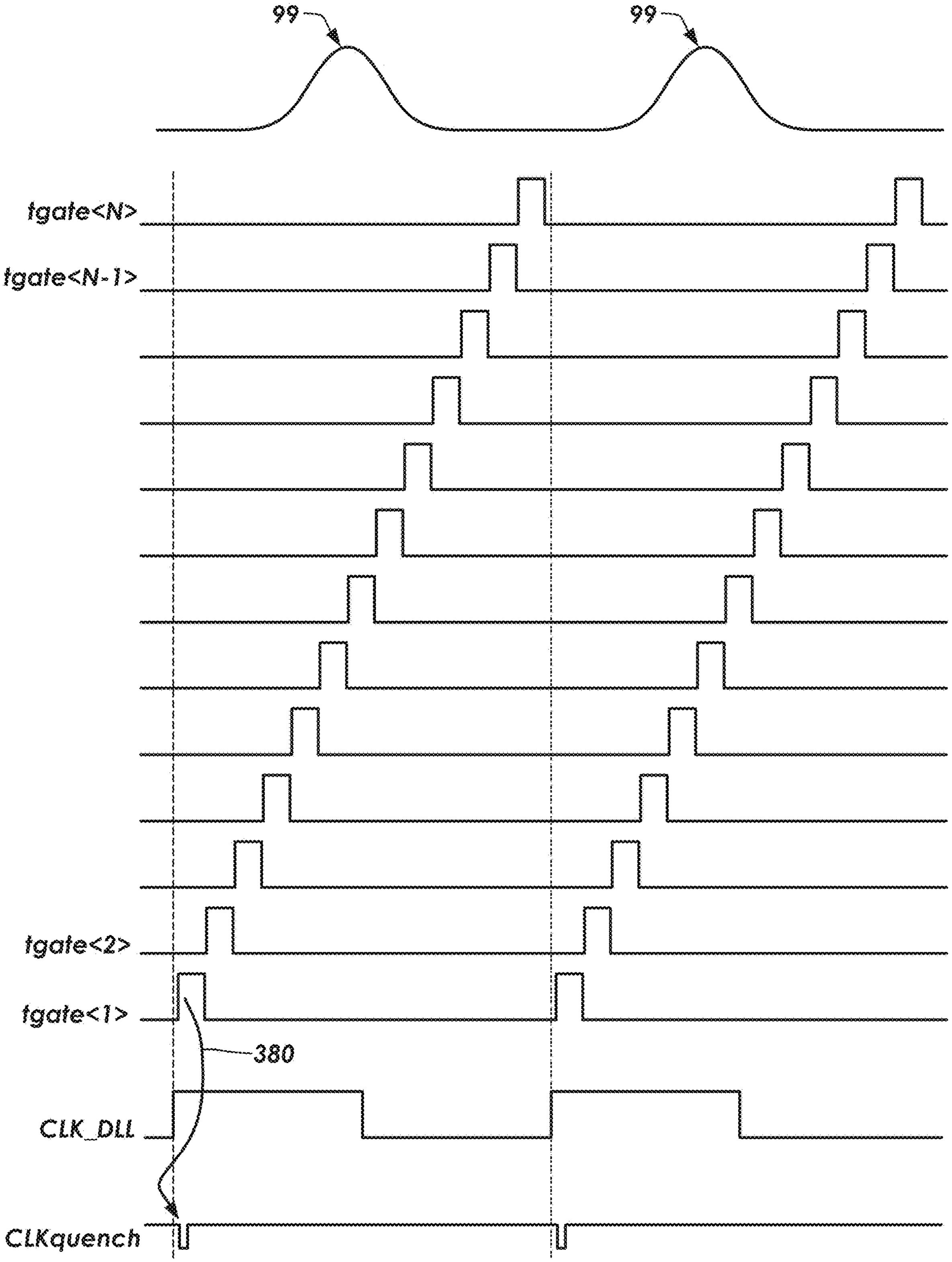
FIG. 8 is a timing diagram showing illustrative waveforms associated with the operation of at least one of the time gate driver circuits of FIG. 7 in accordance with some embodiments.

FIG. 8 is a timing diagram showing illustrative waveforms associated with the operation of a time gate driver circuit 270. As shown in FIG. 8, time gate driver circuit 270 can be configured to output N time gate signals tgate<1>, tgate<2>, . . . , tgate<N−>, and tgate<N>, which can be a sequence of pulses that are non-overlapping in time. The time gate signals are thus sometimes referred to as time gate "pulse" signals or pulses. These time gate pulse signals occur one after another such that the falling edge of one pulse signal is temporally aligned with the rising edge of a subsequent pulse signal. These N time gate pulses are evenly distributed in time and are locked in placed by the DLL clock signal CLK_DLL. In other words, time gate signals tgate<1>, tgate<2>, . . . , tgate<N−>, and tgate<N> are evenly distributed in time over a period of signal CLK_DLL.

As shown in the example of FIG. 8, the quench clock signal CLKquench (see also FIG. 4) can have a pulse that is triggered by the rising edge of the first time gate signal tgate<1>, as shown by arrow 380. This pulse in signal CLKquench, sometimes referred to as a quench clock pulse, may represent a blind spot in time and distance. In accordance with an embodiment, the time gate driver circuitry and the quenching logic can be configured such that the quench clock pulse is triggered based on a random one of the time gate signals, which can be technically advantageous to help randomize the occurrence of the blind spots. For example, the quench clock pulse can be triggered based on an edge of tgate<1> during a first time period, can be triggered based on an edge of tgate<N−2> during a second time period following the first time period, can be triggered based on tgate<4> during a third time period following the second time period, can be triggered based on tgate<10> during a fourth time period following the third time period, etc.

Figure 9:
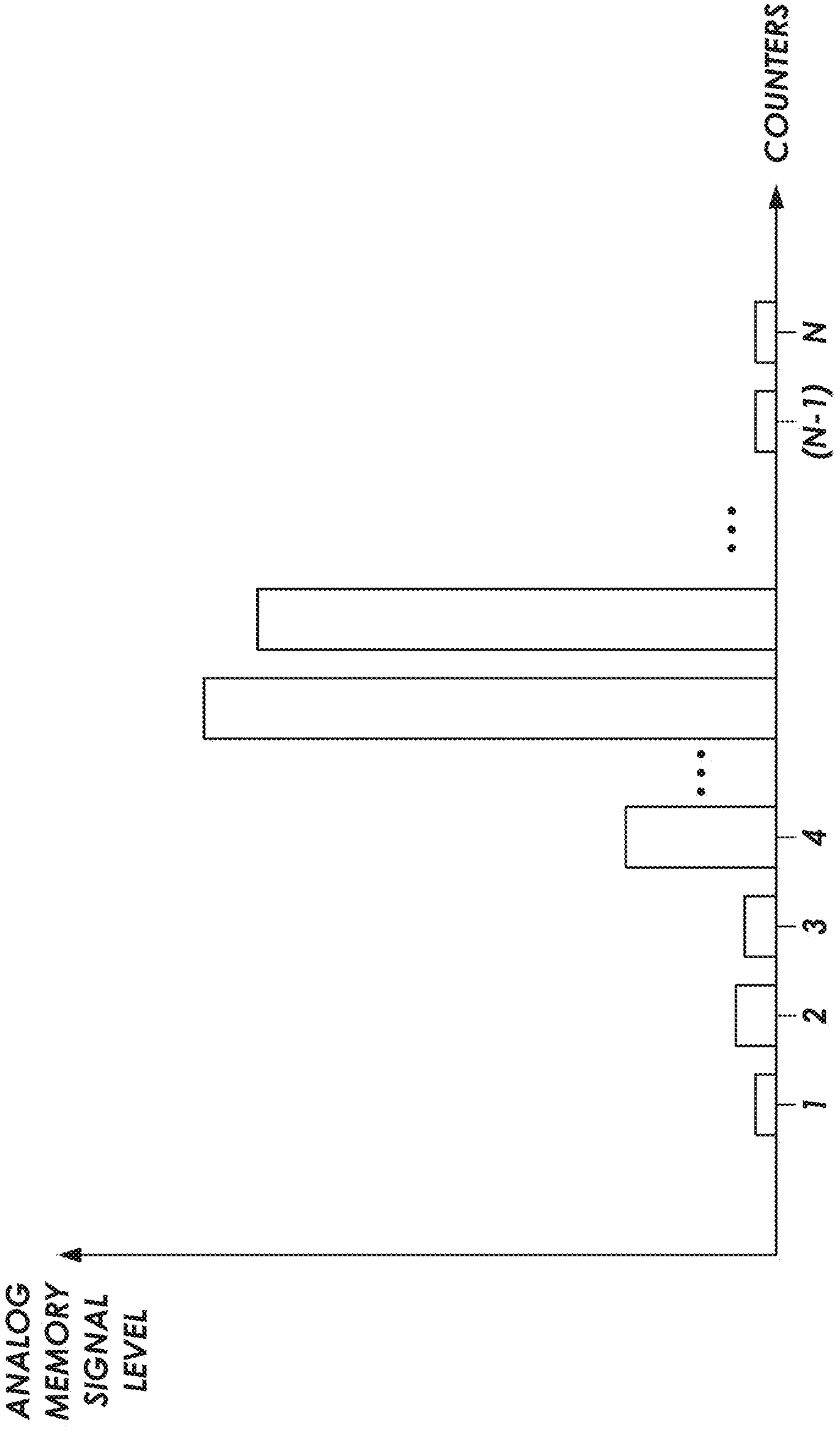
FIG. 9 is a diagram showing how multiple counters within an image pixel of the type shown in FIGS. 3-4 can be used to obtain an in-pixel histogram in accordance with some embodiments.

An incoming laser pulse such as laser pulse 99 shown in FIG. 8 can arrive at any point in time. Each incoming laser pulse 99 can overlap with one or more of the N time gate signals. Since the N time gate signals are each being fed to a corresponding one of the N counters 106 in image pixel 34, the count values tallied using counters 106 can effectively construct a histogram of the type shown in FIG. 9. As shown in FIG. 9, each of the N counter 106 can produce a respective analog memory signal level, collectively yielding a histogram. A peak detection circuit such as peak detector 262 of FIG. 4 can be used to identify a centroid of the histogram to determine a time of the arrival for the laser pulse 99. Such arrangement in which the histogram building occurs entirely within image pixel 34 can be referred to and defined herein as "in-pixel histogramming." Such in-pixel histogramming does not need to rely on an off-sensor time-to-digital converter or other external processing pipeline to compute the time of arrival, which can help reduce motion artifacts. Configured in this way, each image pixel 34 can be operated as a standalone, independent depth-sensing unit, which also improves scalability.

The activation each counter 106 is thus triggered or time (temporally) gated by a respective pulse of the associated time gate signal. Referring back to FIG. 4, counter 106-1 is only activated when an incoming VCPG pulse 211 overlaps with the first time gate signal tgate<1>, whereas counter 106-N is only activated when an incoming VCPG pulse 211 overlaps with the $N^{th}$ time gate signal tgate<N>. When there is an overlap between an incoming VCPG pulse 211 and a received time gate signal tgate<i>, the corresponding logic AND gate 230 will output a pulse signal 231 to charge pump 212 in that counter 106. Charge pump 212 can receive pulse 231 and discharge an integration voltage Vint that is stored on an integration node 216. Charge pump 212 may have an output that is coupled to integration node 216. Integration capacitor Cint has a first terminal coupled to node 216 and a second terminal coupled to a ground power supply line 200 (e.g., a power supply line on which a ground voltage is provided). Configured in this way, integration voltage Vint can be stored across the integration capacitor Cint. Precharge transistor 214 can be a p-type (PMOS) transistor having a drain terminal coupled to integration node 216, a source terminal coupled to a second positive power supply line 202-2, and a gate terminal configured to receive a precharge control signal prec_int. Precharge transistor 214 is sometimes referred to as a "reset" transistor or an integration (node) precharge/reset transistor configured to selectively reset integration node 216. A positive power supply voltage can be provided on power supply line 202-2. The power supply voltage on line 202-2 can be the same or can be different from the power supply voltage on line 202-1.

First source follower transistor such as a n-type metal-oxide-semiconductor (NMOS) source follower (SF) transistor 220 can have a drain terminal coupled to a third positive power supply line 202-3, a gate terminal coupled to integration node 216, and a source terminal coupled to a memory select transistor 222. A positive power supply voltage can be provided on power supply line 202-3. The power supply voltage on line 202-3 can be the same or can be different from the power supply voltages on line 202-1 or 202-2. Memory select transistor 222 can have first source-drain terminal coupled to the first source follower transistor 220, a gate terminal configured to receive a memory select control signal mem_select, and a second source-drain terminal coupled to a storage node 223 within analog memory circuit 110. Memory select transistor 222 can optionally be considered part of analog memory circuit 110.

Analog memory circuit 110 can include multiple analog memory capacitors such as C1, C2, and C3, and multiple associated capacitor switches. A first analog memory capacitor C1 may be coupled in series with a first capacitor switch controlled by signal csel1 between storage node 223 and a voltage line 201 (e.g., a voltage line on which a memory bias voltage Vmem can be provided). Memory bias voltage Vmem can be equal to the ground voltage, greater than or less than the ground voltage, a negative voltage, a positive voltage, or 0 V. A second analog memory capacitor C2 may be coupled in series with a second capacitor switch controlled by signal csel2 between storage node 223 and voltage line 201. A third analog memory capacitor C3 may be coupled in series with a third capacitor switch controlled by signal csel3 between storage node 223 and voltage line 201. Analog memory circuit 110 can also include a memory precharge switch such as an NMOS transistor controlled by memory precharge control signal prec_mem. Signal prec_mem can be asserted to selectively activate the memory precharge transistor to discharge storage node 223 to bias voltage Vmem.

The example of FIG. 4 in which analog memory 110 includes three capacitors C1-C3 is illustrative. In general, analog memory 110 can include one or more capacitors and associated switches, four or more capacitors and associated switches, four to eight capacitors and associated switches, 8-16 capacitors and associated switches, or more than 16 capacitors and associated switches. The memory capacitors may be significantly smaller than the integration capacitor Cint. For example, integration capacitor Cint may be at least five times larger than one or more of the memory capacitors, at least 10 times larger than one or more of the analog memory capacitors, 10-50 times larger than one or more of the analog memory capacitors, 50-100 times larger than one or more of the analog memory capacitors, 100-1000 times larger than one or more of the analog memory capacitors, or more than 1000 times larger than one or more of the analog memory capacitors. The various analog memory capacitors C1, C2, and C3 can have the same size or can have different sizes.

Second source follower transistor such as a n-type metal-oxide-semiconductor (NMOS) source follower (SF) transistor 250 can have a drain terminal coupled to a fourth positive power supply line 202-4, a gate terminal coupled to storage node 223, and a source terminal coupled to row select transistor 252. A positive power supply voltage can be provided on power supply line 202-4. The power supply voltage on line 202-4 can be the same or can be different from the power supply voltages on line 202-1, 202-2, or 202-3. Row select transistor 252 can have a drain terminal coupled to the second source follower transistor 250, a gate terminal configured to receive a row select control signal row_sel, and a source terminal coupled to a pixel readout line 254. Row select control signal row_sel can be selectively asserted by row control circuitry 40 (FIG. 2) for reading out a memory output voltage pixout based the current voltage level at storage node 223. Source follower transistor 250 and row select transistor 252 may also be considered part of readout circuitry 104 in FIG. 3.

The analog memory circuit 110 of each counter 106 may be coupled to a different respective pixel output line. In the example of FIG. 4, the row select transistor 252 of the first counter 106-1 may be selectively activated to produce a corresponding memory output voltage pixout<1> on the first pixel output line 254-1, whereas the row select transistor 252 of the last counter 106-N may be selectively activated to produce a corresponding memory output voltage pixout<N> on pixel output line 254-N. These analog memory output voltages output from the N counters 106 can represent the amount of charge accumulated in the N respective bins of the in-pixel histogram, as shown and described in connection with FIG. 9. The N pixel output lines 254 may be coupled to respective data converter circuits such as analog-to-digital converters 260. The analog-to-digital converters 260 can be configured to convert the analog memory output voltages into corresponding digital codes. A peak detector 262 can receive the digital codes output from the analog-to-digital converters 260 and subsequently identify a peak or centroid of the histogram corresponding to the bin with the highest count value. This information can then be correlated with the corresponding time gate signal of that bin to determine the time of arrival of an incoming laser (photon) pulse. The ADCs 260 and peak detector 262 can be disposed at the periphery of the image pixel array.

Figure 10:
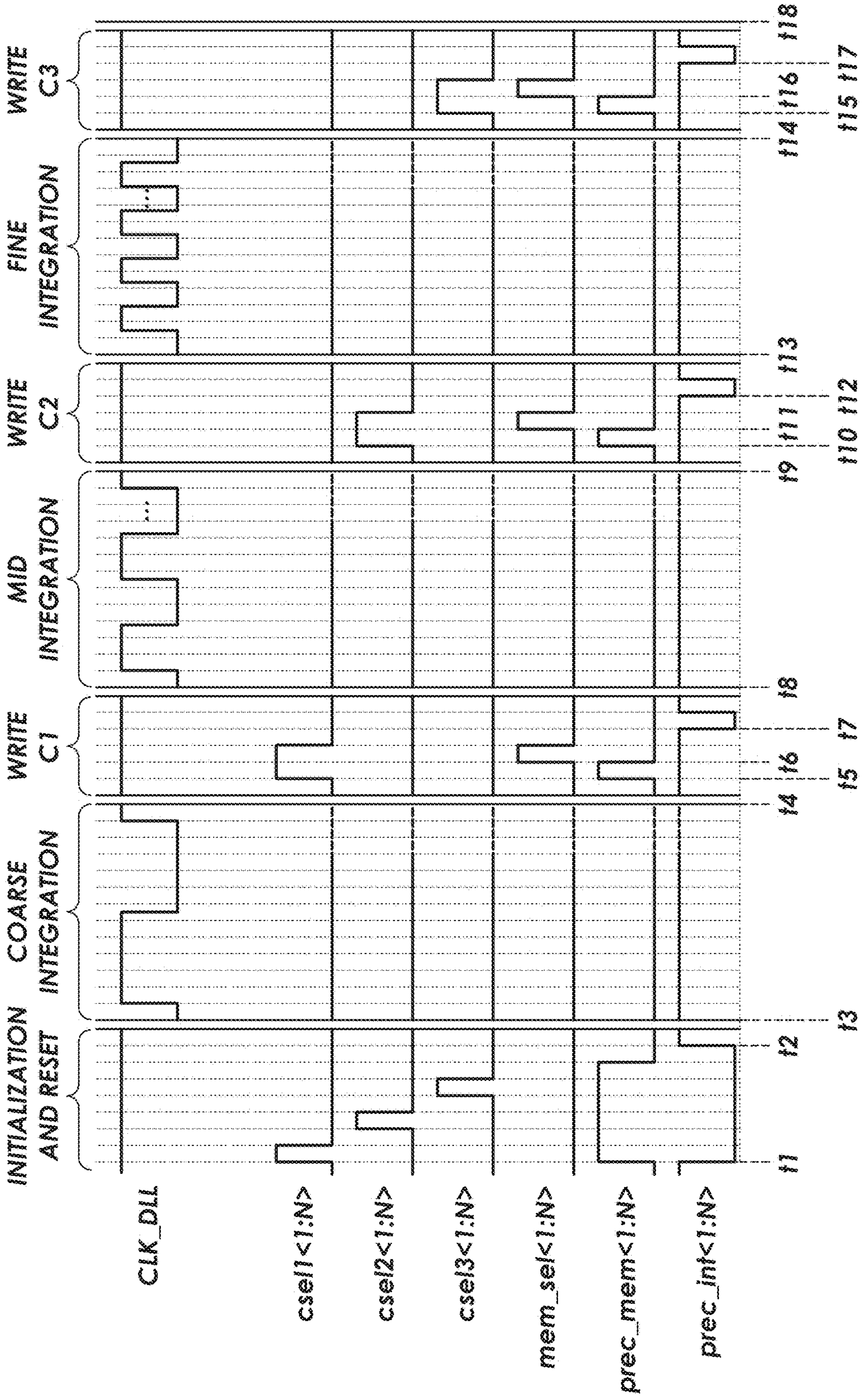
FIG. 10 is a timing diagram illustrating the behavior of relevant signals for operating a SPAD based image pixel of the type described in connection with FIGS. 1-9 in accordance with some embodiments.

The operation of the SPAD based image pixel 34 of the type described in connection with FIGS. 1-9 is further illustrated in conjunction with the timing diagram of FIG. 10. As shown in FIG. 10, image pixel 34 can be operated in accordance with multiple exposure rates. From time t1 to t2, sometimes referred to and defined herein as an initialization and reset phase, the integration node precharge transistor 214 of each counter 106 can be activated by asserting signal prec_int<1:N> to reset or precharge integration voltage Vint. During this time, the memory precharge transistor of each counter 106 can be activated by asserting signal prec_mem<1:N> to discharge the analog memory storage node 223 to bias voltage Vmem. While signal prec_mem<1:N> is asserted, signals csel1<1:N> for controlling switches coupled in series with memory capacitor C1 in each counter 106, csel2<1:N> for controlling switches coupled in series with memory capacitor C2 in each counter 106, and csel3<1:N> for controlling switches coupled in series with memory capacitor C3 in each counter 106 can be sequentially asserted as shown in FIG. 10 to reset or drain the charge from each of the memory capacitors.

From time t3 to t4, sometimes referred to and defined herein as a "coarse integration" or "coarse exposure" phase/period, the root DLL clock signal CLK_DLL controlling time gate driver circuitry 300 can be operated at a first (coarse) frequency. Doing so results in time gate driver circuitry 300 producing time gate signals tgate<1:N> have a relatively long(er) pulse width.

From time t5 to t8, sometimes referred to and defined herein as a first memory writing or loading phase/period, the current integration voltage Vint can be passed through to storage node 223 and then loaded onto the first memory capacitor C1. This can be accomplished by asserting control signal csel1<1:N> of each counter 106 at time t5, asserting prec_mem<1:N> to reset capacitor C1 at time t5, deasserting prec_mem<1:N> at time t6 while simultaneously or subsequently asserting signal mem_sel<1:N> to pass integration voltage Vint onto storage node 223 through the first source follower transistor 220 in each counter 106. Since signal csel1<1:N> remains asserted during this time, any voltage passed onto storage node 223 will then be written onto capacitor C1. At time t7, signal prec_int is temporarily asserted to reset integration node 216.

From time t8 to t9, sometimes referred to and defined herein as a "mid integration" or "mid exposure" phase/period, the root DLL clock signal CLK_DLL controlling time gate driver circuitry 300 can be operated at a second (intermediate) frequency. The second frequency can be some multiple of the first (coarse) frequency. For example, the second frequency can be 2-20 times or more than 20 times greater than the first (coarse) frequency. Doing so results in time gate driver circuitry 300 producing time gate signals tgate<1:N> have a relatively short(er) pulse width relative to those produced during the coarse integration period.

From time t10 to t13, sometimes referred to and defined herein as a second memory writing or loading phase/period, the current integration voltage Vint can be passed through to storage node 223 and then loaded onto the second memory capacitor C2. This can be accomplished by asserting control signal csel2<1:N> of each counter 106 at time t10, asserting prec_mem<1:N> to reset capacitor C2 at time t10, deasserting prec_mem<1:N> at time t11 while simultaneously or subsequently asserting signal mem_sel<1:N> to pass integration voltage Vint onto storage node 223 through the first source follower transistor 220 in each counter 106. Since signal csel2<1:N> remains asserted during this time, any voltage passed onto storage node 223 will then be written onto capacitor C2. At time t12, signal prec_int is temporarily asserted to reset integration node 216.

From time t13 to t14, sometimes referred to and defined herein as a "fine integration" or "fine exposure" phase/period, the root DLL clock signal CLK_DLL controlling time gate driver circuitry 300 can be operated at a third (fine) frequency. The third (fine) frequency can be some multiple of the second frequency. For example, the third frequency can be 2-20 times or more than 20 times greater than the second (intermediate) frequency. Doing so results in time gate driver circuitry 300 producing time gate signals tgate<1:N> have a relatively short(er) pulse width relative to those produced during the mid integration period.

From time t15 to t18, sometimes referred to and defined herein as a third memory writing or loading phase/period, the current integration voltage Vint can be passed through to storage node 223 and then loaded onto the third memory capacitor C3. This can be accomplished by asserting control signal csel3<1:N> of each counter 106 at time t15, asserting prec_mem<1:N> to reset capacitor C3 at time t15, deasserting prec_mem<1:N> at time t16 while simultaneously or subsequently asserting signal mem_sel<1:N> to pass integration voltage Vint onto storage node 223 through the first source follower transistor 220 in each counter 106. Since signal csel3<1:N> remains asserted during this time, any voltage passed onto storage node 223 will then be written onto capacitor C3. At time t17, signal prec_int is temporarily asserted to reset integration node 216.

The timing of FIG. 10 is illustrative. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times. In some embodiments, the described operations may be distributed in a larger system.

Signals written respectively onto capacitors C1, C2, and C3 in each counter 106 in this way can be respectively read out to produce a coarse pixel output value, a mid pixel output value, and a fine pixel output value. The use of three different exposure or integration periods can thus produce a coarse histogram, a mid histogram, and a fine histogram. In other words, capacitor C1 can be used to obtain the coarse histogram; capacitor C2 can be used to obtain the mid (intermediate) histogram; and capacitor C3 can be used to obtain the fine histogram. Obtaining multiple in-pixel histograms of different scales in this way can be technically advantageous and beneficial for extending the dynamic range and depth precision of the image sensor.

The example of FIG. 10 employing three different exposure/integration phases is illustrative. In general, image pixel 24 can be operable to employ one or more exposure periods using two different CLK_DLL frequencies, three or more exposure periods using three different CLK_DLL frequencies, or four or more exposure periods using four different CLK_DLL frequencies. The number of analog memory capacitors in each analog memory circuit 110 may also depend on the number of exposure periods being employed. As an example, if only two (coarse and fine) exposure periods are employed, then analog memory circuit 110 of each counter 106 might only need two analog memory capacitors C1 and C2. As another example, if four exposure periods are employed, then analog memory circuit 110 of each counter 106 will need four separate analog memory capacitors C1-C4.

The foregoing is merely illustrative and various modifications can be made to the described embodiments. The foregoing embodiments may be implemented individually or in any combination.

What is claimed is:

1. An image sensor pixel comprising:
- a single-photon avalanche diode (SPAD);
- a pulse generator having an input coupled to the SPAD; and
- a plurality of counters, wherein each counter in the plurality of counters is coupled to an output of the pulse generator and configured to receive a respective one of a plurality of time gate signals, the plurality of counters comprising:
- a first counter having a first logic AND gate with a first input coupled to the output of the pulse generator and a second input configured to receive a first of the plurality of time gate signals; and
- a second counter having a second logic AND gate with a first input coupled to the output of the pulse generator and a second input configured to receive a second of the plurality of time gate signals, wherein the plurality of time gate signals comprises a plurality of non-overlapping pulses.

2. The image sensor pixel of claim 1, further comprising:
- a quenching transistor coupled to the SPAD; and
- a cascode transistor coupled between the quenching transistor and the SPAD.

3. The image sensor pixel of claim 1, wherein each counter in the plurality of counters further comprises:
- a logic gate configured to output a pulse signal;
- a charge pump having an input configured to receive the pulse signal from the logic gate and having an output coupled to an integration node;
- an integration capacitor coupled to the integration node; and
- an integration precharge transistor coupled to the integration node.

4. The image sensor pixel of claim 3, wherein each counter in the plurality of counters further comprises:
- a first source follower transistor having a gate terminal coupled to the integration node;
- a memory select transistor coupled between the first source follower transistor and a storage node;
- a second source follower transistor having a gate terminal coupled to the storage node; and
- a row select transistor coupled between the second source follower transistor and a pixel output line.

5. The image sensor pixel of claim 3, wherein each counter in the plurality of counters further comprises:
- an analog memory circuit coupled to the integration node, wherein the analog memory circuit comprises a memory precharge transistor configured to precharge a storage node of the analog memory circuit to a memory bias voltage level.

6. The image sensor pixel of claim 5, wherein the analog memory circuit further comprises:
- a first capacitor;
- a first capacitor switch coupled between the first capacitor and the storage node;
- a second capacitor; and
- a second capacitor switch coupled between the second capacitor and the storage node.

7. The image sensor pixel of claim 6, wherein the first capacitor is configured to store signals produced while the plurality of time gate signals are generated using clock signals of a first frequency, and wherein the second capacitor is configured to store signals produced while the plurality of time gate signals are generated using clock signals of a second frequency different than the first frequency.

8. The image sensor pixel of claim 6, wherein the analog memory circuit further comprises:
- a third capacitor; and
- a third capacitor switch coupled between the third capacitor and the storage node, wherein the first capacitor is configured to store signals produced while the plurality of time gate signals are generated using clock signals of a first frequency, wherein the second capacitor is configured to store signals produced while the plurality of time gate signals are generated using clock signals of a second frequency that is a multiple of the first frequency, and wherein the third capacitor is configured to store signals produced while the plurality of time gate signals are generated using clock signals of a third frequency that is a multiple of the second frequency.

9. A method of operating an image sensor pixel, comprising:
- with a single-photon avalanche diode (SPAD), detecting a light signal and outputting a corresponding voltage;
- with a pulse generator, outputting a pulse in response to detecting an edge in the voltage output from the SPAD;
- with each counter in a plurality of counters, receiving the pulse output from the pulse generator and receiving a respective one of a plurality of time gate signals;
- during a first integration phase, using a clock signal of a first frequency to generate the plurality of time gate signals; and
- following the first integration phase, loading a voltage at an integration node into a first capacitor of an analog memory circuit in each counter in the plurality of counters.

10. The method of claim 9, further comprising:
- with the plurality of counters, obtaining an in-pixel histogram for determining a time of arrival of the light signal.

11. The method of claim 9, further comprising:
- during a reset phase, resetting the integration node in each counter in the plurality of counters; and
- during the reset phase, resetting the analog memory circuit in each counter in the plurality of counters.

12. The method of claim 9, further comprising:

during a second integration phase, using a clock signal of a second frequency, different than the first frequency, to generate the plurality of time gate signals; and following the second integration phase, loading a voltage at the integration node into a second capacitor of the analog memory circuit in each counter in the plurality of counters.

13. The method of claim 12, further comprising:

during a third integration phase, using a clock signal of a third frequency, different than the first and second frequencies, to generate the plurality of time gate signals; and following the third integration phase, loading a voltage at the integration node into a third capacitor of the analog memory circuit in each counter in the plurality of counters.

14. Imaging circuitry comprising:

an array of image pixels, wherein each image pixel in the array comprises;

a single-photon avalanche diode (SPAD);

a pulse generator having an input coupled to the SPAD; and a plurality of counters configured to obtain an in-pixel histogram; and time gate driver circuitry configured to output a plurality of non-overlapping time gate pulses to the plurality of counters; and wherein the plurality of counters comprises:

a first counter having a first logic AND gate with a first input coupled to an output of the pulse generator and a second input configured to receive a first of the plurality of non-overlapping time gate pulses; and a second counter having a second logic AND gate with a first input coupled to the output of the pulse generator and a second input configured to receive a second of the plurality of non-overlapping time gate pulses.

15. The imaging circuitry of claim 14, wherein the pulse generator has a control input configured to receive a control voltage from a delay-locked loop.

16. The imaging circuitry of claim 14, wherein the time gate driver circuitry comprises:

a reference delay-locked loop; and a plurality of time gate driver circuits configured to receive a control voltage from the reference delay-locked loop, wherein a first time gate driver circuit in the plurality of time gate driver circuits is coupled to a first group of image pixels in the array, and wherein a second time gate driver circuit in the plurality of time gate driver circuits is coupled to a second group of image pixels, different than the first group of image pixels, in the array.

17. The imaging circuitry of claim 14, wherein the plurality of counters in each image pixel of the array each comprise:

a first capacitor configured to store charge for obtaining a coarse histogram; and a second capacitor configured to store charge for obtaining a fine histogram.

18. The imaging circuitry of claim 17, wherein the plurality of counters in each image pixel of the array each further comprise:

a third capacitor configured to store charge for obtaining an additional histogram, wherein the coarse histogram is obtained while a clock signal controlling the time gate driver circuitry has a first frequency, wherein the fine histogram is obtained while the clock signal controlling the time gate driver circuitry has a second frequency greater than the first frequency, and wherein the additional histogram is obtained while the clock signal controlling the time gate driver circuitry has a third frequency greater than the first frequency and less than the second frequency.

* * * * *